(12) United States Patent
Blasco Claret et al.

(10) Patent No.: US 7,433,428 B2
(45) Date of Patent: Oct. 7, 2008

(54) METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION

(75) Inventors: Jorge Vicente Blasco Claret, Valencia (ES); Juan Carlos Riveiro Insúa, Valencia (ES); Agustín Badenes Corella, Castellón (ES)

(73) Assignee: Diseno de Sistemas en Silicio, S.A., Paterna (Valencia) (ES)

( * ) Notice: Subject to any disclaimer, the term of this patent is extended or adjusted under 35 U.S.C. 154(b) by 108 days.

(21) Appl. No.: 11/284,799

(22) Filed: Nov. 22, 2005

(65) Prior Publication Data

US 2006/0159201 A1 Jul. 20, 2006

Related U.S. Application Data

(63) Continuation of application No. PCT/ES2004/000223, filed on May 19, 2004.

(30) Foreign Application Priority Data

May 26, 2003 (ES) ................................ 200301229

(51) Int. Cl.
H03D 3/22 (2006.01)

(52) U.S. Cl. ...................... 375/330; 375/348; 375/269; 375/340; 329/319; 329/320
(58) Field of Classification Search ................. 375/330, 375/340, 348, 269; 455/561; 329/319, 320
See application file for complete search history.

(56) References Cited

U.S. PATENT DOCUMENTS

| 6,735,264 B2* | 5/2004 | Miller ......................... 375/340 |
| 2004/0142728 A1* | 7/2004 | Tari et al. ..................... 455/561 |
| 2004/0197103 A1* | 10/2004 | Roberts et al. ............... 398/159 |

\* cited by examiner

*Primary Examiner*—Chieh M. Fan
*Assistant Examiner*—Eva Puente
(74) *Attorney, Agent, or Firm*—Klauber & Jackson, LLC

(57) ABSTRACT

This method reduces the variance of the estimation of the signal-to-noise rate in a multiuser digital communications system. These communications require a sending of a phase reference symbol prior to sending a information, where the estimation is made of the signal-to-noise rate in order to use a modulation with a maximum number of bits per symbol, maintaining a bit error probability in reception within certain given margins. The method minimizes and equalizes the variance of the samples obtained for the different values, even and odd of bits per carrier, which the system uses. The estimation is necessary for selecting the number of bits per carrier in order to be adapted to the channel and as back-up information in the event of using a receiver with diversity.

9 Claims, 4 Drawing Sheets

METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION

RELATED APPLICATIONS

The present application is a Continuation of co-pending PCT Application No. PCT/ES2004/000223, filed May 19, 2004, which in turn, claims priority from Spanish Application Serial No. P200301229, filed May 26, 2003. Applicants claim the benefits of 35 U.S.C. §120 as to the PCT application and priority under 35 U.S.C. §119 as to said Spanish application, and the entire disclosures of both applications are incorporated herein by reference in their entireties.

OBJECT OF THE INVENTION

As stated in the title of this specification, the present invention refers to a procedure for reduction of the variance of the estimation of the signal-to-noise rate of a signal with amplitude differential phase-shift keying modulation.

The procedure of the invention is applicable to communications systems independently of the physical medium used for the communication.

This procedure permits the variance of the estimations to be reduced and to equalize that variance among the optimum constellations of odd and even bits per symbol. In this way, the system can be adapted to the maximum data transfer rate offered by the channel.

BACKGROUND TO THE INVENTION

In telecommunications systems for sending information via a communications channel, the information needs to be modulated; in other words, it needs to be adapted and matched to the channel.

Some of the main problems that a receiver of digital communications encounters are equalization, which entails an estimation of the channel, and frequency deviation of the receiver clock with respect to the transmitter. When QAM (square amplitude modulation) coherent modulations are used, where the point of the constellation is determined by the amplitude and phase of the signal sent, the demodulator has to be made much more complex in order to tackle the problems stated above. One solution consists of using differential modulations or DAPSK (amplitude and phase differential modulation) where the information is coded in the amplitude and phase increments. This differential coding eliminates the need for estimation of the channel in reception and to a large degree minimizes the effects of frequency deviation between the clocks. But this reduction in the complexity of the receiver when using a totally differential modulation is associated with an increase in the bit error probability for the same SNR (signal to noise ratio) value compared to the performance of QAN modulations. ADPSK modulation (amplitude differential phase-shift keying modulation) is known in the state of the art as it appears in "Comparison and optimization of differentially encoded transmission on fading channels", L. Lampe and R. Fischer, Proceedings ISPLC'99; "Performance evaluation of non-coherent transmission over power lines", L. Lampe, R. Fischer and R. Schober, Proceedings ISPLC'00; "Differential encoding strategies for transmission over fading channels", R. Fischer, L. Lampe and S. Calabró, International Journal on Electronics and Communications; as a mixed modulation between the above two and which represents the intermediate point in terms of performance and complexity of receiver between them both. In other words, it minimizes the problem implied by frequency deviation between the clocks of the transmitter and receiver in a digital communications system and decreases the complexity of estimation of the channel since it is only necessary to estimate the channel in amplitude. So, ADPSK modulation represents the best compromise between performance and complexity of the receiver for a practical implementation.

Moreover, in order to obtain at all times the maximum data transfer rate, the bits per carrier of the modulation need to be adapted to the capacity offered by the channel. In other words, given a target bit error probability, the aim is to use the maximum number of bits per carrier that ensure an error probability equal to or less than that value. Also, in a point to multipoint or multipoint to multipoint multiuser communication, a transmitter can send information to several receivers with different channels between that transmitter and each of the receivers in a single data frame. Therefore, different constellations will be used in the same frame. So, it is necessary to estimate the signal-to-noise rate (SNR) perceived by the receiver in order to choose the number of bits per carrier to use.

Another important factor for achieving that maximum data transfer rate is to minimize the overhead (control information on the system necessary for a correct reception of the data and which is sent along with it). This overhead is more important if transmission strategies are used based on the use of multiple carriers such as OFDM (orthogonal frequency division multiplexing) where the symbol times are much greater and contain a lot more information than in a digital communication in which a single information carrier frequency is used.

ADPSK modulation has two important requirements. The first is that, owing to the fact that part of the information is coded in the phase increments, a symbol previously needs to be sent constituting a phase reference for the receiver. Also, the rest of the information is coded in the value of the amplitude of the received symbol. So, the second requirement implies estimating the value of the amplitude of the response from the channel in order to correct its effect in the receiver. Moreover, real channels display a certain variation in their characteristics with time, which compels the receiver to conduct a monitoring and updating of that initial estimation. In addition, this time variation also requires a continual updating of the estimation of the SNR.

The articles cited above describe the functioning of the ADPSK modulator and demodulator and its performance, without considering the possibility of employing different constellations within a single data frame. This possibility is considered and resolved in the Spanish patent application P-200301120 (unpublished), referring to a "Procedure for phase differential amplitude coherent modulation standardized for multiuser communication", which permits the sending of a single phase reference at the beginning of the frame and facilitates a practical implementation of the low-complexity modulator.

Moreover, this procedure permits the insertion of data symbols in the frame in such a way that users to which the data from the transmitter is not directed, and who do not know the constellation with which it is modulated, can monitor the channel and follow its variations in both amplitude and SNR.

Therefore, in order to optimize the data transfer in a multiuser communication, it is necessary to make an estimation of the SNR perceived by the receiver. This estimation can only be made when the constellation in which the received data is modulated is known by the receiver. Also, the period during which the SNR is estimated can include symbols modulated with different constellations.

Thus, the problem to solve consists of estimating the SNR in the receiver of a signal with ADPSK modulation during a period comprising reception of a certain number of data symbols with the possibility that they are modulated using different constellations. In the article "A comparison of SNR estimation techniques for the AWGN channel", D. Pauluzzi and N. Beaulieu, IEEE Transactions on Communication, vol. 48, N° 10, October 2000, various techniques are presented for estimating the SNR of a signal with coherent phase modulation (PSK). Also, it is stated how to extend those techniques to a QAM modulation. In both cases, no account is taken of the fact that the constellation can change during the estimation time.

The average power of the transmitted signal can be known if the constellation is normalized in power and the effect of the channel in reception is equalized. Then, in order to estimate the SNR in the receiver, it is merely necessary to estimate the noise power in the received constellation. This estimation of the noise power is easily done by means of averaging the samples of the noise power. So, the problem consists of calculating those samples in the receiver. But another added problem is the differential character of the phase in ADPSK modulation; in this case the constellation received is the constellation formed by the amplitudes and the phase increments that are received. If the value of the samples of the noise power is obtained by means of calculating the modulus squared of the noise vector given by the error in amplitude and by the error in phase increment, without any modification, it is observed that the estimation presents a greater variance in the constellations of odd bits per symbol. This effect is not admissible because the period during which the SNR is estimated can include symbols modulated with different constellations in an optimum multiuser communications system. This communications system also includes transmissions aimed at multiple users (multicast) or at all of them (broadcast), as well as transmission to a single user (unicast).

The procedure of the proposed invention presents a method of estimating the SNR of a signal with ADPSK modulation which equalizes the variances of the estimation in constellations with even and odd bits per symbol, furthermore reducing the variance of that estimation for all cases.

DESCRIPTION OF THE INVENTION

In order to achieve the objectives and avoid the drawbacks stated in the above sections, the invention consists of a procedure for reduction of the variance of the estimation of the signal to noise ratio of a signal with phase differential amplitude coherent modulation. Said procedure is applicable to two-way communication of multiple sets of user equipment in which an amplitude differential phase-shift keying modulation is used, which requires the sending of a phase reference symbol prior to sending the information, and where an estimation is made of the signal-to-noise rate with the aim of using a modulation with the maximum number of bits per symbol, maintaining the bit error probability in reception within certain given margins. The procedure of the invention is characterized in that, starting from the amplitude error and the error in the phase increment corresponding to the received point of the constellation, a translation is performed of those errors to the corresponding point of the first ring of the constellation as if this had been the one that was transmitted and without those errors undergoing any modification, and later on the modulus squared of the error vector is calculated. This characteristic permits samples of noise to be calculated, the variance of the values obtained to be reduced and that variance to be equalized among the optimum constellations of odd and even bits per symbol.

Moreover, an average can be taken of the modulus squared of the noise samples in order to estimate the average value of the noise power, the number of samples to average being a configurable value of the system.

In reception, first of all the amplitude and the phase increment are detected, and then those values are subtracted from the received amplitude or phase increment, or vice versa, in other words, the detected amplitude and phase increment are respectively subtracted from the received amplitude and phase increment; thus, an initial form of calculating the noise samples is done in blind mode, without knowing the symbol transmitted in the calculation of the amplitude and phase increment errors.

Another way of obtaining the modulus squared of the noise vector consists of respectively subtracting the received amplitude and phase increment from the amplitude and phase increment of the transmitted symbols previously known in reception, or vice versa, in other words, the amplitude and phase increment of the transmitted previously symbols known in reception are respectively subtracted from the received amplitude and phase increment; thus, the samples of noise are calculated using a sequence of symbols previously known in reception for the calculation of the amplitude and phase increment errors.

In order to improve the final estimation, the invention provides for combining the above estimations, in such a way that the receiver equipment which estimates the signal to noise ratio combines blind estimations with estimations with a known sequence of symbols.

Also, as this is a multiuser communications system, the samples of the noise power to average can belong to different constellations. So, in order to correct the bias of the estimator due to the differential character of the modulation and of different value in each constellation, each of the samples of the noise power being averaged is multiplied by the corresponding correction factor, where this correction factor is the inverse function of the bias of the estimator.

Below, in order to facilitate a better understanding of this specification and forming an integral part thereof, some figures are included in which the object of the invention has been represented in a manner that is illustrative rather than limiting.

DESCRIPTION OF AN EMBODIMENT OF THE INVENTION

Given below is a description of an example of the invention, making reference to the numbering adopted in the figures.

As has been mentioned in the section on the background to the invention, the basic operations which an ADPSK receiver has to perform are compensating for the effect of attenuation of the channel in amplitude and calculating the phase increment in the received signal. After that, the detector is what is responsible for obtaining the transmitted information. All these operations are known in the state of the art and appear in the references cited earlier.

Figure 1:
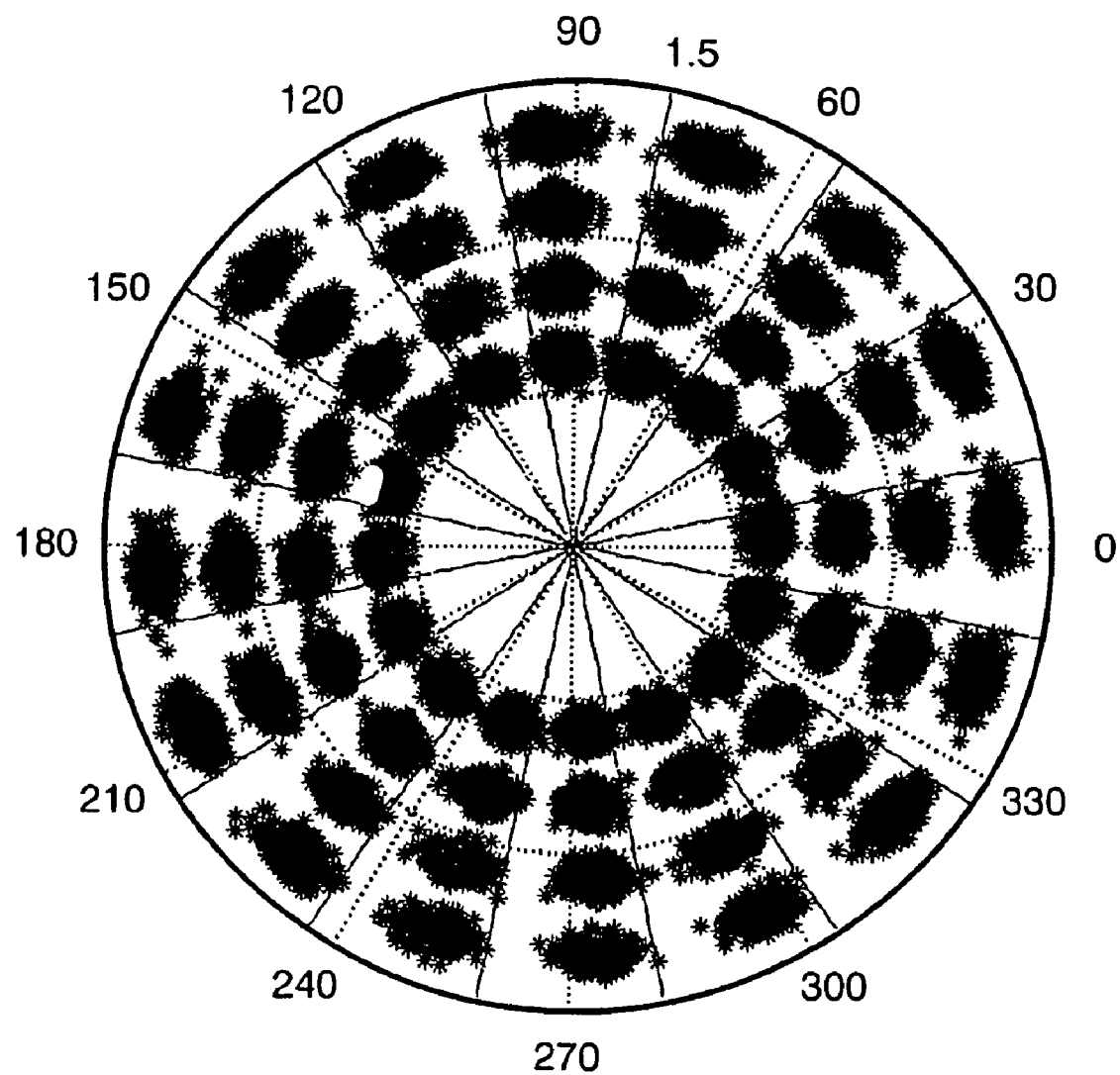
FIG. 1. Represents a constellation formed by the amplitudes and phase increments of an ADPSK constellation of 6 bits per symbol.

FIG. 1 shows an example in which the constellation is formed from the equalized amplitude and the phase increment of the received signal for a constellation of 6 bits per symbol with an SNR of 27.9 decibels (dB) and a frequency error of 5 parts per million (ppm). The continuous radial lines represent the optimum thresholds of decision for the phase increments. It is also observed that the received points are grouped into clouds of points with an elliptical shape, which becomes more pronounced when the amplitude of the rings is greater, due to the differential nature of the modulation. These clouds of points are centred on each of the points of the constellation and are due to the noise which is added to the signal. But, as can be seen, the clouds of points are not centred between the optimum thresholds but are instead displaced by a certain number of radians. This fixed displacement is determined by the frequency error in the receiver.

Figure 2:
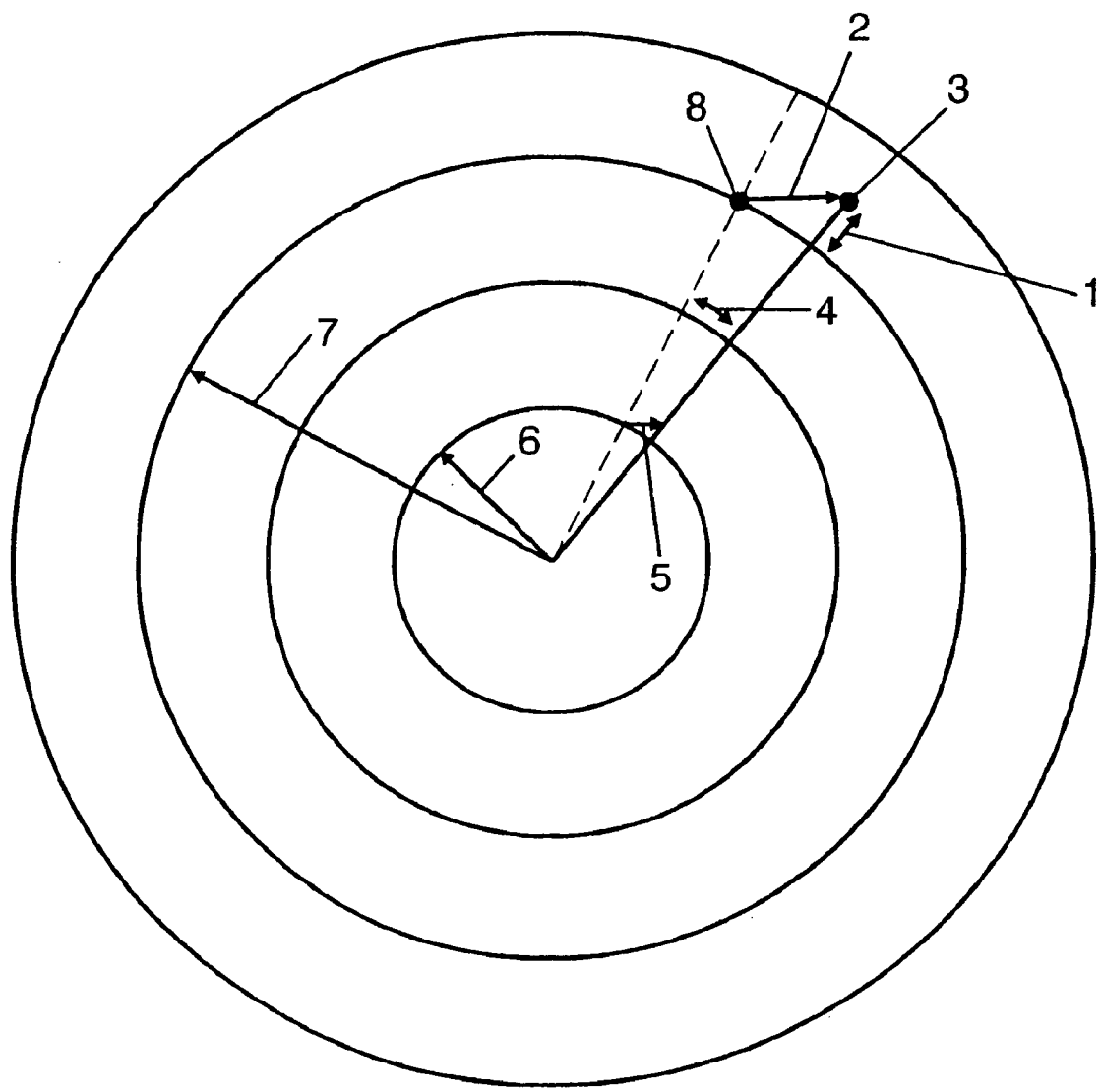
FIG. 2. Schematically represents the magnitudes involved in calculating a sample of noise power.

Given that the power of the transmitted signal is known, the SNR estimator only has to estimate the noise power which the receiver suffers. For this, an average is taken of N samples of noise power in different symbols:

$$E[|e(k)|^2] = \frac{\sum_{k=1}^{N} |e(k)|^2}{N}$$

Where $|e(k)|^2$ is the kth sample of the noise power affecting the receiver. FIG. 2 shows a schematic presentation of the magnitudes involved in calculating the samples of that power. The starting data will be the amplitude error $e_k$ (1), and the error in the phase increment $e_{\phi_k}$ (4) of the received point of the constellation (3), with respect to the detected point (8), which are calculated as follows:

$$e_k = \overline{A}_k - \hat{A}_k$$

$$e_{\phi_k} = \Delta\overline{\phi}_k - \Delta\hat{\phi}_k$$

Where $\overline{A}_k$ is the detected amplitude, $\hat{A}_k$ is the received amplitude equalized in order to compensate the attenuation of the channel, $\Delta\overline{\phi}_k$ is the detected phase increment and $\Delta\hat{\phi}_k$ is the received phase increment. The sample of the noise power is obtained by calculating the modulus squared of the vector (2):

$$|e(k)|^2 = r_3^2 + (r_3 - e_k)^2 - 2r_3(r_3 - e_k)\cos(e_{100_k})$$

Where $r_3$ (7) is the detected amplitude $\overline{A}_k$ for the example shown in FIG. 2. Therefore the formula would become:

$$|e(k)|^2 = \overline{A}_k^2 + \hat{A}_k^2 - 2\overline{A}_k\hat{A}_k \cos(e_{\phi_k})$$

Which represents the modulus squared of the error vector (2). This is the simplest and most immediate way of calculating the samples of the noise power, but it provokes differences between the variance of the estimator of the constellations with odd and even bits per symbol. As explained earlier, when the amplitude of the ring is greater, so the cloud of points acquires a more pronounced elliptical shape. As the optimum constellations with an odd number of bits per symbol proportionally present more rings than phases compared with those with an even number of bits per symbol, they show the effect described above in a way that is more visible. For the same value of SNR, the greater the amplitude of the detected point, the greater will be the average of the modulus squared of the noise vector. So, N samples of noise power calculated starting from a constellation with an odd number of bits per symbol will present a greater scattering than N samples calculated starting from a constellation with an even number of bits. Therefore, the variance which the estimator will present in the constellations of odd bits per symbol will be greater. Also, that same effect of increment in the size of the ellipses of points as the amplitude of the ring increases also causes an increase in the variance for a given constellation.

Therefore, the objective is to make the samples independent of the noise power of the ring to which the detected point belongs.

So, one could think of projecting the error vector (2) onto the first ring of radius $r_1$ (6), with which the kth sample of the noise power of projected onto the first ring e'(k) (5) is obtained, using for this the theory of similar triangles. Therefore, for the example of embodiment described in FIG. 2, the new sample of the noise power can be calculated as:

$$|e'(k)|^2 = \left(\frac{r_1}{r_3}\right)^2 |e(k)|^2$$

But in this way, none of the problems set out earlier are solved, since the amplitude error (1) is modified as a function of the ring of the constellation to which the detected point belongs.

Figure 3:
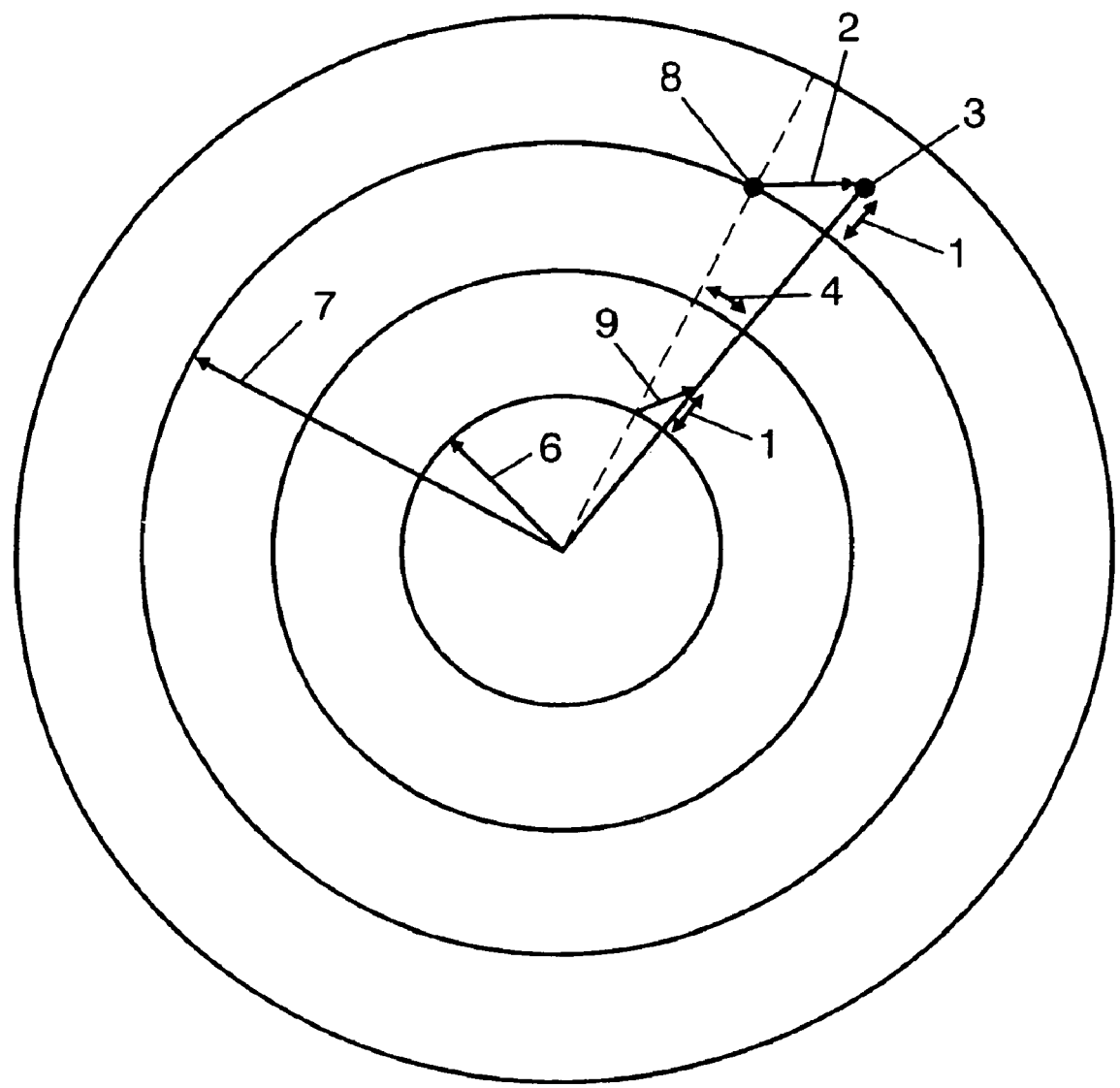
FIG. 3. Schematically represents the magnitudes involved in calculating a sample of noise power and its translation to the first ring.

The procedure of the invention that is presented solves these problems by translating the phase error and the amplitude error to the corresponding point of the first ring of the constellation as if this was the one that had been detected. FIG. 3 represents an example of embodiment in which this translation is made. So, the samples of the noise power, which is the modulus squared of the new error vector (9), are calculated as follows:

$$|e'(k)|^2 = r_1^2 + (r_1 - e_k)^2 - 2r_1(r_1 - e_k)\cos(e_{\phi_k})$$

Where $r_1$ (6) is the amplitude of the first ring of the corresponding constellation. Also, as explained earlier, the average of N samples is taken for calculating the noise power in the same way:

$$E[|e'(k)|^2] = \frac{\sum_{k=1}^{N} |e'(k)|^2}{N}$$

Figure 4:
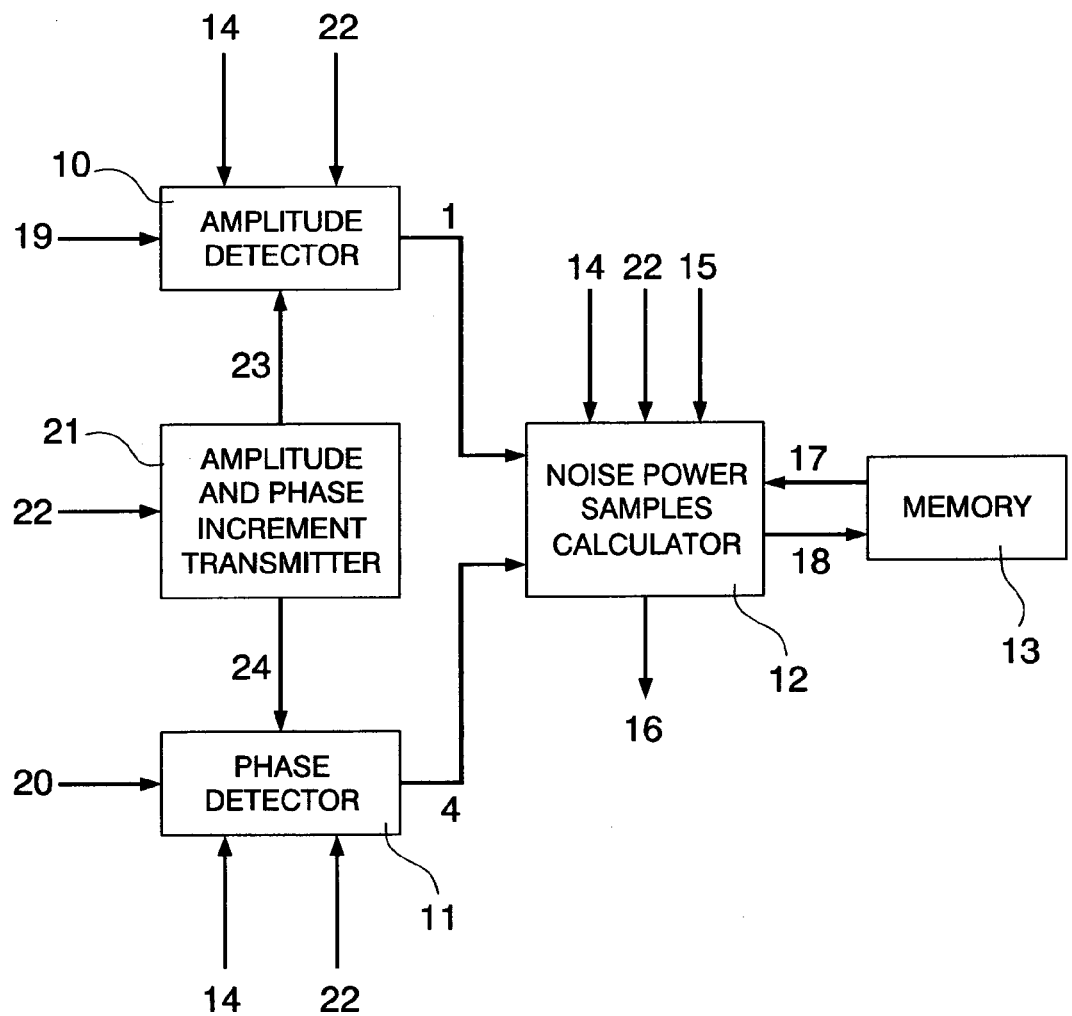
FIG. 4. Represents an example of a block diagram of a receiver implementing the procedure of the invention.

FIG. 4 shows an example of a block diagram of a receiver implementing the procedure of the invention that is presented. The starting data needed by the block calculating the samples of the noise power (12) are the amplitude error $e_k$ (1), the phase error elk (4) and the number of bits of the constellation (14). The amplitude and phase errors are calculated by an amplitude detector (10) and by a phase detector (11), respectively. In order to calculate these two errors, the equalized amplitude $\hat{A}_k$ (19), the received phase increment $\Delta\hat{\phi}_k$ (20) and the number of bits per symbol of the constellation (14) are required. Moreover, the calculation of the phase (4) and amplitude (1) errors can be done in two ways. The first consists of calculating those errors on the basis of the detection of the amplitude (19) and of the phase increment (20) that are received; in other words, the sequence of symbols sent by the transmitter is not known. This mode is known as blind estimation and is affected by detection errors, which prevents the SNR from being estimated properly when these errors occur, since the calculated errors will be smaller in magnitude than those which have actually taken place and the estimation of the SNR will be greater than that which is really affecting the system. The second way of calculating the phase and amplitude errors is based on a knowledge of the transmitted sequence, due to which those errors will correspond exactly to those produced when there is no detection involved in the process. In this example of embodiment, both are done, so by means of a block (21) the values of amplitude $\overline{A}_{ki}$ (23) and of phase increment $\Delta\Phi_{ki}$ (24) that are transmitted are generated. There has to exist an identical block in the transmitter so that the sequences in transmission and reception can be equal. A signal (22) informs on the type of estimation being done, blind mode or with known sequence. So, the amplitude (10) and phase (11) detectors will in this case only have to carry out subtraction between the values (19) and (23) in the case of amplitude, and between the values (24) and (20) in the case of phase increment.

As this concerns a multiuser communications system, the receiver will not always recognise the constellation with which the data being received is modulated. It will only know it in a unicast communication when it is the destination of the transmitted data or when a multicast communication is made which includes it in the group of recipients or in a broadcast; for that reason, the N samples of the noise power which are averaged can belong to different constellations. A signal (15) indicates that the constellation is known and that the samples of the noise power can be calculated.

By means of simulations, it is confirmed that the estimator described so far in this invention procedure is biased. This bias is due to the differential character of the modulation, since the phase increment is affected by the noise of two symbols and is detailed in the following table as a function of the constellation:

| Bits | Bias (dB) | Correction factor: K |
|------|-----------|----------------------|
| 2    | −1.9      | 0.645654229          |
| 3    | −0.6      | 0.87096359           |
| 4    | −0.95     | 0.8035261222         |
| 5    | 0.03      | 1.006931669          |
| 6    | −0.25     | 0.9440608763         |

The block (12) has to apply this correction factor K to the samples of the noise power in order to correct the biased nature of the estimator, by means of:

$$|e'(k)|^2 = (r_1^2 + (r_1 - e_k)^2 - 2r_1(r_1 - e_k)\cos(e_{\phi_k})) \cdot K$$

The number of bits per symbol (14) serves to determine value of $r_1$ (6) and of the correction factor K to use in the calculation. This correction has to be made sample by sample since these samples can belong to different constellations. As an average of the samples of taken, a memory (13) is needed for storing the partial value of the summation presented earlier. So, the operation carried out by the block (12) is as follows:

$$E'(k) = (r_1^2 + (r_1 - e_k)^2 - 2r_1(r_1 - e_k)\cos(e_{\phi_k})) \cdot K + \sum_{i=1}^{k-1} E'(i)$$

Where the value E'(k) (18) is stored in the memory (13) once it has been calculated. Before calculating the value (18), the block (12) has to read the term $$\sum_{i=1}^{k-1} E'(i)$$

(17) from the memory (13). When the value of k is equal to N, which is a configurable parameter of the system and which can be different in the two possible estimation modes, the block (12) generates a signal (16) indicating that there is an estimation of noise power available. A signal (22) again indicates the estimation mode, blind or with known sequence, which will determine the number of samples N to accumulate. When the signal (16) so indicates, the memory is read and the value is divided by the corresponding value N.

The estimation mode with known sequence is more reliable than the blind mode, though it has the drawback of not permitting data to be sent to the receivers. Also, the SNR of the channel needs to be monitored so that the system can adapt the number of bits per symbol to use. Moreover, it is also necessary to detect sudden changes of channel and change the constellation as far as possible so that the minimum number of packets are lost. These considerations are much more important in a multiuser OFDM communications system where each symbol contains a lot of information. For this reason, both estimations are combined.

Furthermore, the larger the value of N, the smaller will be the variance of the estimation. But in a system like the above, this value cannot be arbitrarily large, because each OFDM symbol can, depending on the number of carriers and on the bits with which each of them is being modulated, contain a large quantity of data. Therefore, an estimation with known sequence implies sending N symbols without information (since the sequence is known, it does not contain information) and increasing the overhead, and an estimation in blind mode requires that the information sent by the emitter to the receiver should occupy more than N OFDM symbols, which is not always possible. So, in this example of embodiment, in blind mode N=16 has been chosen and in known sequence N=32.

As an initial estimation, a estimation with known sequence is made. After that, new estimations with known sequence are made with a periodicity of seconds. Between these estimations, blind mode estimations can be made (depending on the data traffic), which are used for determining whether any sudden change of channel has taken place. In the event that the change of channel causes a significant worsening of the real SNR, an estimation will need to be made with known sequence in order to prevent the error from occurring in the blind estimation, described earlier.

The invention claimed is:

1. A METHOD OF REDUCNG THE VARIANCE OF THE SIGNAL-TO-NOISE RATE ESTIMATED FOR A SIGNAL WITH AMPLITUDE DIFFERENTIAL PHASE-SHIFT KEYING MODULATION, applicable to a two-way communication system of multiple sets of user equipment in which amplitude differential phase-shift keying modulation ADPSK is used, which requires a sending of a phase reference symbol prior to sending an information, and where an estimation is made of the signal-to-noise rate in order to use a modulation with a maximum number of bits per symbol, maintaining a bit error probability in reception within certain given margins; said method comprising:
    receiving a symbol with known modulation (bits per carrier), measuring an amplitude error using an amplitude dectected by an amplitude detector, that is the detected amplitude, over the symbol received, measuring an error in the phase increment using a phase increment detected by a phase detector, that is the detected phase increment, over the symbol received, translocating the amplitude error and the error in the phase increment to a first ring of the constellation, as if the received symbol had been transmitted in that ring, calculating a noise-power as the square of the modulus of the error vector, where said error vector is formed by the amplitude error and the error in the phase increment, where said noise-power is accumulated and averaged; in order to calculate noise samples, reduce the variance of the signal to noise rate and equalize said variance among optimum constellations of odd and even bits per symbol, estimating the signal-to-noise rate with the noise-power previously calculated and the known power of the ADPSK signal, selecting the modulation with the maximum number of bits per symbol keeping probability error of bit in reception inside the given margins using the estimated signal-to-noise rate previously calculated.

2. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, in accordance with claim 1, wherein an average of the square of the modulus of the noise samples is taken in order to estimate the average value of the noise power, the number of samples to average being a configurable value of the system.

3. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, according to claim 1, wherein the amplitude and phase increment are detected in reception, and the detected amplitude and phase increment are selectively subtracted from a received amplitude and a received phase increment, respectively, or a received amplitude and a received phase increment are subtracted from the detected amplitude and the detected phase increment, respectively; in order to calculate the noise-power samples in blind mode.

4. A METHOD OF REDUCING THE VARIANCE OF THE SIGNAL-TO-NOISE RATE ESTIMATED FOR A SIGNAL WITH AMPLITUDE DIFFERENTIAL PHASE-SHWFT KEYING MODULATION, according to claim 1, wherein a sequence of symbols known in reception is sent and selectively, a received amplitude and a received phase increment are subtracted from the amplitude and the phase increment of the signals previously transmitted and known in reception, respectively, or the amplitude and phase increment of the signals previously transmitted and known in reception are subtracted from a received amplitude and a received phase increment, respectively; in order to calculate the amplitude and phase increment errors and, thereafter, the noise-power samples.

5. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, according to claim 2 wherein, in the estimation of the signal to noise ratio in reception, estimations in blind mode are combined with estimations with known sequence of symbols, in order to improve estimation.

6. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, according to claim 3, wherein, in the estimation of the signal to noise ratio in reception, estimations in blind mode are combined with estimations with known sequence of symbols, in order to improve the estimation.

7. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, according to claim 4, wherein, in the estimation of the signal to noise ratio in reception, estimations in blind mode are combined with estimations with known sequence of symbols, in order to improve the estimation.

8. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, according to claim 2, wherein the samples of the noise-power to average belong to different constellations.

9. A METHOD OF REDUCING THE VARIANCE OF THE SIGNAL-TO-NOISE RATE ESTIMATED FOR A SIGNAL WITH AMPLITUDE DIFFERENTIAL PHASE-SHIFT KEYING MODULATION, according to claim 8, wherein the bias of the estimators, due to the differential character of the modulation and to the different value in each constellation, is corrected independently in each of the noise-power samples being averaged, multiplying each sample by a correction factor, where this correction factor, which is unique to each sample, is the inverse function of the bias of the estimator.

* * * * *